(12) United States Patent
Gunturi et al.

(10) Patent No.: US 7,817,422 B2
(45) Date of Patent: *Oct. 19, 2010

(54) HEAT SINK AND COOLING AND PACKAGING STACK FOR PRESS-PACKAGES

(75) Inventors: Satish Sivarama Gunturi, Albany, NY (US); Mahadevan Balasubramaniam, Ballston Lake, NY (US); Ramakrishna Venkata Mallina, Clifton Park, NY (US); Richard Alfred Beaupre, Pittsfield, MA (US); Le Yan, Schenectady, NY (US); Richard S. Zhang, Rexford, NY (US); Ljubisa Dragoljub Stevanovic, Clifton Park, NY (US); Adam Gregory Pautsch, Rexford, NY (US); Stephen Adam Solovitz, Portland, OR (US)

(73) Assignee: General Electric Company, Niskayuna, NY (US)

( * ) Notice: Subject to any disclaimer, the term of this patent is extended or adjusted under 35 U.S.C. 154(b) by 253 days.

This patent is subject to a terminal disclaimer.

(21) Appl. No.: 12/193,441

(22) Filed: Aug. 18, 2008

(65) Prior Publication Data

US 2010/0038058 A1 Feb. 18, 2010

(51) Int. Cl.
H05K 7/20 (2006.01)

(52) U.S. Cl. .............. 361/699; 257/714; 174/15.1; 165/80.4; 165/104.33

(58) Field of Classification Search .............. None
See application file for complete search history.

(56) References Cited

U.S. PATENT DOCUMENTS

| 4,010,489 A | 3/1977 | Bourbeau et al. |
| 4,029,141 A | 6/1977 | Ferrari et al. |
| 4,313,128 A | 1/1982 | Schlegel et al. |
| 4,392,153 A | 7/1983 | Glascock, II et al. |
| 4,559,580 A * | 12/1985 | Lutfy ............... 361/689 |
| 4,614,227 A | 9/1986 | Vogel |

(Continued)

FOREIGN PATENT DOCUMENTS

EP 0989611 8/2004

(Continued)

OTHER PUBLICATIONS

EP 09176561 Search Report, Mar. 29, 2010.

(Continued)

*Primary Examiner*—Boris L Chervinsky
(74) *Attorney, Agent, or Firm*—Penny A. Clarke

(57) ABSTRACT

A heat sink for directly cooling at least one electronic device package is provided. The electronic device package has an upper contact surface and a lower contact surface. The heat sink comprises a cooling piece formed of at least one thermally conductive material. The cooling piece defines multiple inlet manifolds configured to receive a coolant and multiple outlet manifolds configured to exhaust the coolant. The inlet and outlet manifolds are interleaved. The cooling piece further defines multiple millichannels configured to receive the coolant from the inlet manifolds and to deliver the coolant to the outlet manifolds. The millichannels and inlet and outlet manifolds are further configured to directly cool one of the upper and lower contact surface of the electronic device package by direct contact with the coolant, such that the heat sink comprises an integral heat sink.

22 Claims, 3 Drawing Sheets

U.S. PATENT DOCUMENTS

| | | | |
|---|---|---|---|
| 5,006,921 A | 4/1991 | Ishizuka et al. | |
| 5,221,851 A | 6/1993 | Gobrecht et al. | |
| 5,423,376 A | 6/1995 | Julien et al. | |
| 5,495,889 A | 3/1996 | Dubelloy | |
| 5,705,853 A | 1/1998 | Faller et al. | |
| 5,727,618 A * | 3/1998 | Mundinger et al. | 165/80.4 |
| 5,978,220 A | 11/1999 | Frey et al. | |
| 6,014,312 A | 1/2000 | Schulz-Harder et al. | |
| 6,388,317 B1 * | 5/2002 | Reese | 257/713 |
| 6,473,303 B2 | 10/2002 | Kaufmann | |
| 6,738,258 B2 | 5/2004 | Bijlenga et al. | |
| 6,921,969 B2 | 7/2005 | Knapp | |
| 7,061,104 B2 * | 6/2006 | Kenny et al. | 257/714 |
| 7,139,172 B2 * | 11/2006 | Bezama et al. | 361/699 |
| 7,156,159 B2 | 1/2007 | Lovette et al. | |
| 7,185,697 B2 * | 3/2007 | Goodson et al. | 165/104.33 |
| 7,327,024 B2 | 2/2008 | Stevanovic et al. | |
| 7,331,378 B2 * | 2/2008 | Bhatti et al. | 165/80.4 |
| 7,353,859 B2 | 4/2008 | Stevanovic et al. | |
| 7,414,843 B2 * | 8/2008 | Joshi et al. | 361/699 |
| 7,460,369 B1 * | 12/2008 | Blish, II | 361/699 |
| 7,569,426 B2 * | 8/2009 | Myers et al. | 438/122 |
| 2004/0190251 A1 | 9/2004 | Prasher et al. | |
| 2006/0144565 A1 | 7/2006 | Tsai et al. | |
| 2007/0215325 A1 | 9/2007 | Solovitz et al. | |
| 2007/0295482 A1 * | 12/2007 | Fitzgerald et al. | 165/80.4 |

FOREIGN PATENT DOCUMENTS

| | | |
|---|---|---|
| WO | 0195688 | 12/2001 |
| WO | 0297883 | 5/2002 |

OTHER PUBLICATIONS

"Semiconductor Cooler," Anonymous, Mason Publications, ISSN: 0374-4353, vol. 324, No. 40, Apr. 1, 1991.

Office Action, U.S. Appl. No. 12/193,429, May 3, 2010.

R. S. Zhang et al., "Advanced and Integrated Cooling for Press-Packages," U.S. Appl. No. 12/193,429, filed Aug. 18, 2008.

* cited by examiner

US 7,817,422 B2

HEAT SINK AND COOLING AND PACKAGING STACK FOR PRESS-PACKAGES

BACKGROUND

The invention relates generally to power electronics and, more particularly, to advanced cooling for power electronics.

High power converters, such as medium voltage industrial drives, frequency converters for oil and gas, traction drives, Flexible AC Transmission (FACT) devices, and other high power conversion equipment, for example rectifiers and inverters, typically include press-pack power devices with liquid cooling. Non-limiting examples of power devices include integrated gate commutated thyristors (IGCTs), diodes, insulated gate bipolar transistors (IGBTs), thyristors and gate turn-off thyristors (GTOs). Press-pack devices are particularly advantageous in high power applications, and benefits of press-packs include double-sided cooling, as well as the absence of a plasma explosion event during failure.

To construct a high power converter circuit using press-pack devices, heat sinks and press-pack devices are typically sandwiched to form a stack. State-of-the-art power converter stacks typically employ conventional liquid cooled heat sinks with larger diameter cooling channels. The heat sinks and power devices are not integrated in state of the art power converter stacks. In certain applications, thermal grease layers are disposed between respective ones of the press-pack device and the liquid cooled heat sink. In other applications, at least some of the layers are simply held together by pressure, with no thermal grease in between them. This arrangement results in significant contact resistance. Other shortcomings of such power converter stacks include relatively high thermal impedance from the semiconductor junction to the liquid, as well as a relatively complex stack assembly structure and process due to the number of parts involved.

Accordingly, it would be desirable to improve the thermal performance and packaging of power converter stacks using press-pack devices. More particularly, it would be desirable to reduce the thermal impedance from the semiconductor junction to the liquid for high reliability and/or high power density. It would further be desirable to provide a relatively simplified stack assembly structure for high maintainability.

BRIEF DESCRIPTION

Briefly, one aspect of the present invention resides in a heat sink for directly cooling at least one electronic device package. The electronic device package has an upper contact surface and a lower contact surface. The heat sink comprises a cooling piece formed of at least one thermally conductive material. The cooling piece defines multiple inlet manifolds configured to receive a coolant and multiple outlet manifolds configured to exhaust the coolant. The inlet and outlet manifolds are interleaved. The cooling piece further defines multiple millichannels configured to receive the coolant from the inlet manifolds and to deliver the coolant to the outlet manifolds. The millichannels and inlet and outlet manifolds are further configured to directly cool one of the upper and lower contact surface of the electronic device package by direct contact with the coolant, such that the heat sink comprises an integral heat sink.

Another aspect of the present invention resides in a cooling and packaging stack comprising at least one heat sink. The heat sink comprises a cooling piece defining: multiple inlet manifolds configured to receive a coolant, multiple outlet manifolds configured to exhaust the coolant, and multiple millichannels configured to receive the coolant from the inlet manifolds and to deliver the coolant to the outlet manifolds. The inlet and outlet manifolds are interleaved. The stack further comprises at least one electronic device package comprising an upper contact surface and a lower contact surface. The manifolds and millichannels are disposed proximate to the respective one of the upper and lower contact surfaces for directly cooling the respective surface by direct contact with the coolant, such that the heat sink comprises an integral heat sink.

DRAWINGS

These and other features, aspects, and advantages of the present invention will become better understood when the following detailed description is read with reference to the accompanying drawings in which like characters represent like parts throughout the drawings, wherein.

Figure 1:
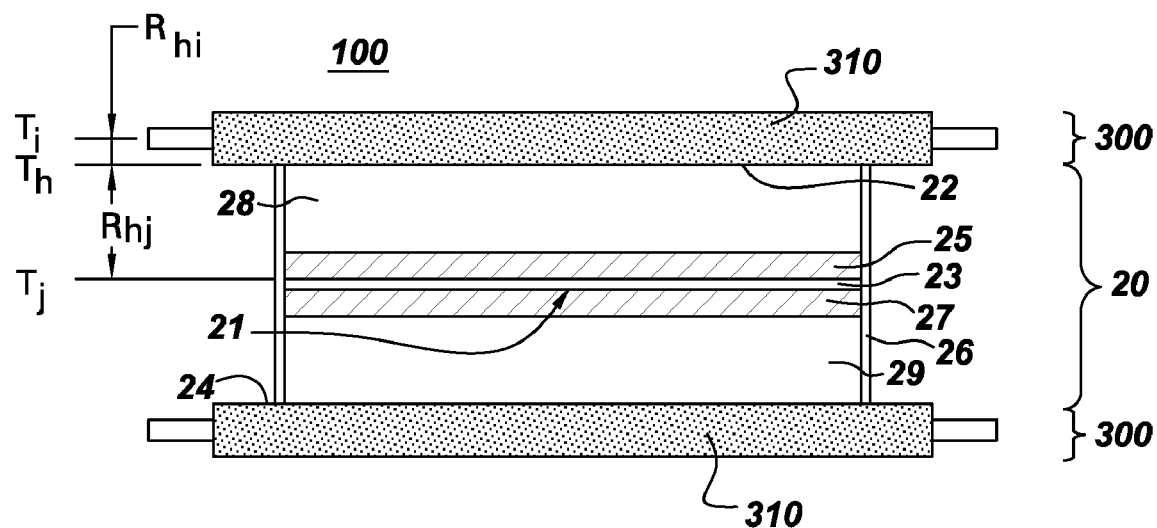
FIG. 1 depicts an electronic device package with upper and lower heatsinks.

Although the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

A heat sink 300 for directly cooling at least one electronic device package 20 is described with reference to FIGS. 1-4. As indicated for example in FIG. 1, an exemplary electronic device package 20 has an upper contact surface 22 and a lower contact surface 24. The heat sink 300 comprises a cooling piece 310 formed of at least one thermally conductive material. As indicated, for example, in FIGS. 2 and 4, the cooling piece 310 defines a number of inlet manifolds 12 configured to receive a coolant and a number of outlet manifolds 14 configured to exhaust the coolant. As shown for example in FIGS. 2, 4, 6 and 8, the inlet and outlet manifolds are interleaved (interdigitated). The cooling piece 310 further defines a number of millichannels 16 configured to receive the coolant from the inlet manifolds and to deliver the coolant to the outlet manifolds. The millichannels 16 and inlet and outlet manifolds 12, 14 are further configured to directly cool one of the upper and lower contact surfaces 22, 24 of the electronic device package 20 by direct contact with the coolant, such that the heat sink comprises an integral heat sink. More particularly, the manifolds 12, 14 and millichannels 16 are disposed proximate to the respective one of the upper and lower contact surfaces 22, 24 for cooling the respective surface by direct contact with the coolant. According to more particular embodiments, the millichannels 16 and inlet and outlet manifolds 12, 14 are configured to deliver the coolant uniformly to the respective one of the upper and lower contact surface 22, 24 of the electronic device package being cooled.

Thus, the heat sink 300 is integral to the electronic device package 20, in that the heat sink 300 cools the electronic device package 20 by direct contact with the coolant. In other words, the millichannels 16 and inlet and outlet manifolds 12, 14 of integral heat sink 300 are open on the side facing the power device package 20, such that the coolant flowing through the millichannels 16 can directly contact the power device package 20. This arrangement is a distinct improvement over the self-contained heat sinks of the prior art, in which the coolant is contained within the heat sink and must thus cool the devices indirectly through the heat sink case. By eliminating these additional thermal layers, the integral heat sink 300 of the present invention provides enhanced cooling of the power devices.

The cooling piece 310 can be formed using a variety of thermally conductive materials, non-limiting examples of which include copper, aluminum, nickel, molybdenum, titanium, alloys thereof, metal matrix composites such as aluminum silicon carbide (AlSiC), aluminum graphite and ceramics such as silicon nitride ceramic. The cooling piece can be cast and/or machined. For example, the cooling piece 310 can be cast and then machined to further define fine features and surface requirements.

Non-limiting examples of the coolant include de-ionized water and other non-electrically conductive liquids.

For particular embodiments, the manifolds 12, 14 have relatively larger diameters than the millichannels 16. In one non-limiting example, the width of the millichannels was in a range of about 0.5 mm to about 2.0 mm, and the depth of the millichannels was in a range of about 0.5 mm to about 2 mm. In particular, the thickness of the channels may be determined to ensure pressure uniformity on the semiconductor. By making the pressure distribution on the semiconductor more uniform, the performance of the semiconductor is not compromised. Further, it should be noted that the millichannels 16 and manifolds 12, 14 could have a variety of cross-sectional shapes, including but not limited to, rounded, circular, trapezoidal, triangular, and square/rectangular cross sections. The channel shape is selected based on the application and manufacturing constraints and affects the applicable manufacturing methods, as well as coolant flow. Beneficially, the incorporation of millichannels 16 into the heat sink 10 significantly increases the surface area of heat conduction from the semiconductor device 20 to the coolant.

In the illustrated arrangements, the inlet and outlet manifolds 12, 14 are disposed in a circular (also referred to herein as axial) arrangement, and the millichannels 16 are disposed in a radial arrangement. In another example (not illustrated), the inlet and outlet manifolds 12, 14 are disposed in a radial arrangement, and the millichannels 16 are disposed in a circular (axial) arrangement. As used herein, the phrases "circular arrangement" and "axial arrangement" should be understood to encompass both curved and straight "circular" passages (either manifolds or millichannels, depending on the embodiment) connecting the radial passages (millichannels or manifolds, depending on the embodiment).

Figure 2:
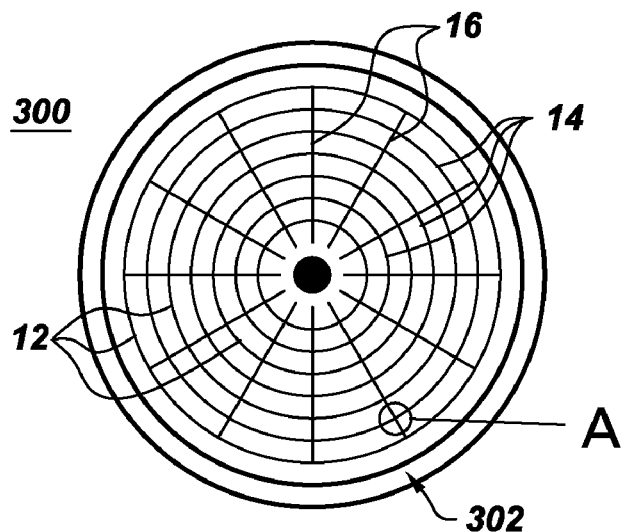
FIG. 2 illustrates a heatsink with millichannels and manifolds incorporated into a single cooling piece.
Figure 4:
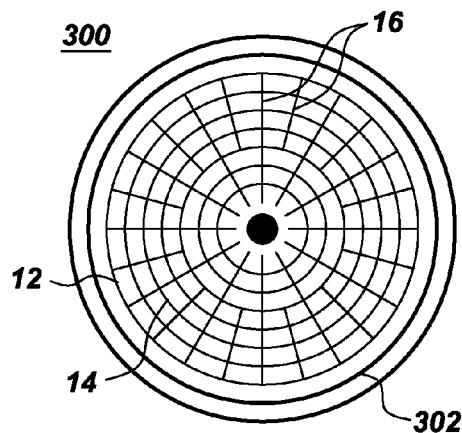
FIG. 4 illustrates a heatsink design, which increases the number of radial channels.
Figure 6:
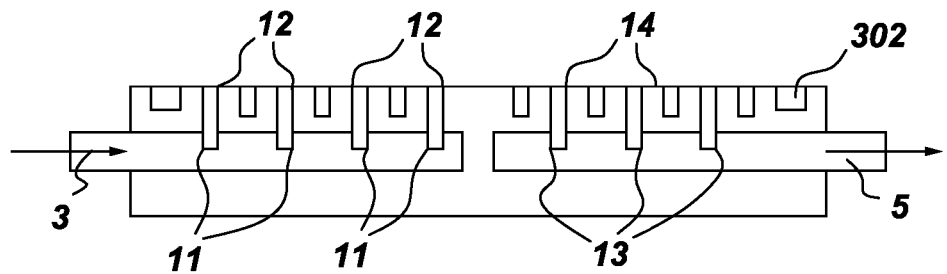
FIG. 6 is a cross-sectional view of the manifold arrangement of FIG. 2 or 4.
Figure 7:
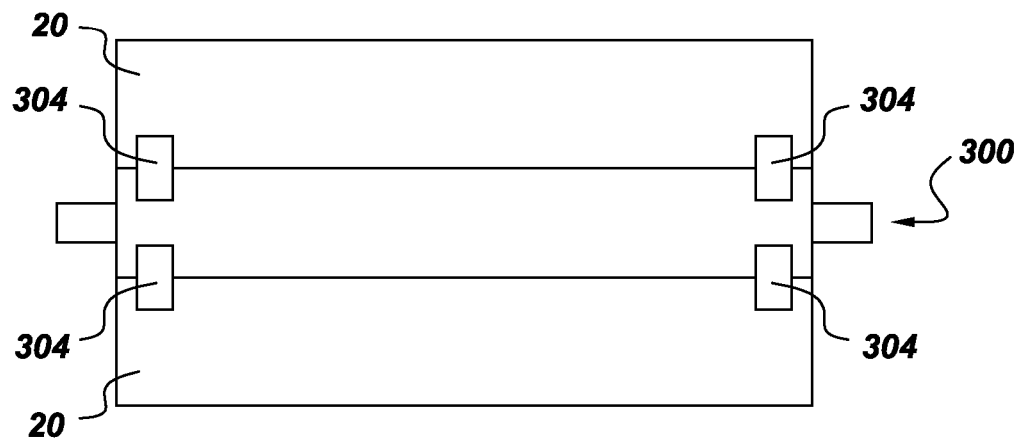
FIG. 7 illustrates a sealing arrangement for a double-sided heatsink of the present invention.

For the example arrangements shown in FIGS. 2 and 4, cooling piece 310 further defines a groove 302 for receiving a gasket 304 (see FIG. 7), such as an O-ring. As indicated in FIG. 7, the gasket 304 is used to seal the heat sink 300 to a neighboring electronic device package 20. As indicated in FIG. 6, for example, the coolant is supplied to heat sink 300 via an inlet plenum 3. The coolant then flows into the inlet manifolds (alternate concentric manifold sections) 12 via inlet ports 11, as indicated in FIG. 6. After passing through the millichannels 16 (see FIG. 2 or 4), the coolant is exhausted from the outlet manifolds 14 (the other alternate concentric manifold sections) via outlet ports 13 to the outlet plenum 5, as indicated in FIG. 6, for example.

Figure 3:
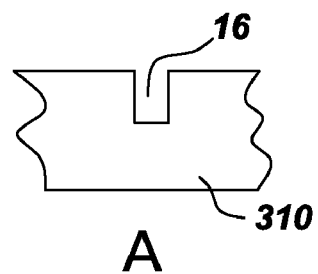
FIG. 3 shows the cross-section of a radial millichannel for the heat sink of FIG. 2 or 4.

FIG. 3 shows the cross-section of a radial channel 16, for example a radial millichannel. FIG. 4 illustrates a design to increase the number of radial channels to facilitate a reduction in pressure drop with a corresponding improvement in cooling efficiency. More particularly, for the example arrangement shown in FIG. 4, the number of radial channels is larger near the circumference of the cooling piece 310 relative to the number of radial channels near the center of the cooling piece 310. This arrangement permits the inclusion of additional radial channels for given spatial and machining constraints.

Beneficially, by incorporating the millichannels and inlet/outlet manifolds into a single cooling piece 310 as illustrated in FIGS. 2-4, for example, the assembly process is simplified. In particular, the use of a single cooling piece 310 eliminates the need to bond two components. Instead, heat sink 300 can be sealed to an adjacent device package 20 using a gasket 304, such as an O-ring assembly, which provides a robust and simple seal between the adjacent components.

For the exemplary embodiments described above with reference to FIGS. 1-4, the upper contact surface 22 and lower contact surface 24 can be circular in cross-section, and the cooling piece 310 can be cylindrical (i.e., a disk or hockey-puck arrangement). However, other geometries can be employed, including without limitation, square and rectangular cross-sections. For the example arrangement depicted in FIG. 1, the electronic device package 20 is a press-package 20. Although the invention is not limited to any specific device structure, the following example press-package configuration is provided for illustrative purposes. In the example, the press-package 20 comprises at least one semiconductor device 21 formed on a wafer 23, upper and lower coefficient of thermal-expansion (CTE) matched plates 25, 27, and upper and lower electrodes 28, 29. The wafer 23 is disposed between the CTE plates 25, 27, the upper electrode 28 is disposed above the upper CTE plate 25, and the lower CTE plate 27 is disposed above the lower electrode 29, as shown for example in FIG. 1. For the press-package embodiment, each of the wafer 23, CTE plates 25, 27 and electrodes 28, 29 may have a circular cross-section. Non-limiting examples of semiconductor devices include IGCTs, GTOs and IGBTs. The present invention finds application to semiconductor devices manufactured from a variety of semiconductors, non-limiting examples of which include silicon (Si), silicon carbide (SiC), gallium nitride (GaN), and gallium arsenide (GaAs). The press-package typically includes an insulating (for example, ceramic) housing 26, as indicated for example in FIG. 1. Although FIG. 1 shows the heat sinks as extending outside the housing 26, in other embodiments, the cooling pieces 310 of the heat sinks 300 are disposed within the housing 26. Moreover, electrodes 28, 29 can extend vertically beyond the bounds of housing 26, for example with a compliant seal disposed between the outer circumference of electrodes 28 (and 29) and the housing 26. In addition, the heat sinks 300 can extend out of the housing (as shown) to enable electrical connections and for placing other devices that need to be cooled. Therefore, the cooling pieces 310 can have a larger diameter than housing 26.

Figure 5:
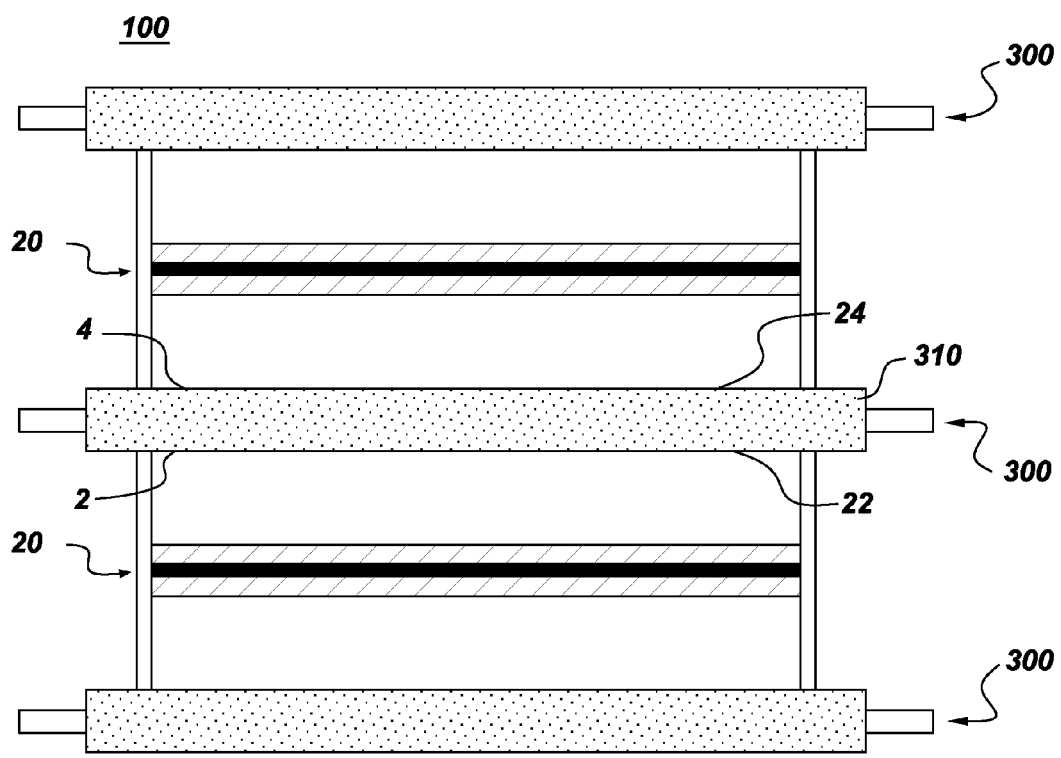
FIG. 5 illustrates a cooling and packaging stack configured for a number of electronic device packages.

The heatsink 300 can be single-sided or double-sided. For example, for the arrangement depicted in FIG. 5, the upper and lower heat sinks 300 are depicted as being one-sided, whereas the middle heat sink 300 is double-sided. A double-sided heat sink is configured for directly cooling multiple (in particular, two) electronic device packages 20. As indicated in FIG. 5, for a double sided heat sink 300, the cooling piece 310 has a first surface 2 and a second surface 4. A first subset of the millichannels 16, inlet manifolds 12 and outlet manifolds 14 are formed in the first surface 2 of the cooling piece 310. (See, for example, the arrangements of FIGS. 2 and 4.) Similarly, a second subset of the millichannels 16, inlet manifolds 12 and outlet manifolds 14 are formed in the second surface 4 of the cooling piece 310. (See, for example, the arrangements of FIGS. 2 and 4.) The first subset of millichannels is configured to directly cool an upper contact surface 22 of one of the electronic device packages 20 by direct contact with the coolant, and the second subset of millichannels is configured to directly cool a lower contact surface 24 of another of the electronic device packages 20 by direct contact with the coolant.

Figure 8:
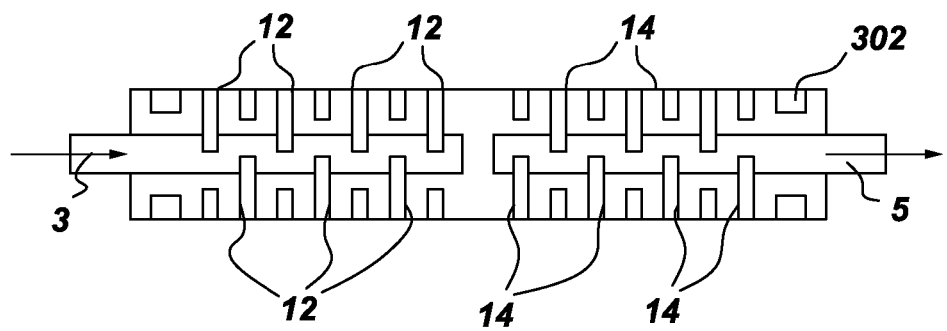
FIG. 8 is a cross-sectional view illustrating an offset manifold arrangement for a double sided heat sink embodiment of the present invention.

FIG. 8 depicts an offset arrangement of inlet and outlet manifolds for a double-sided heat sink. As indicated in FIG. 8, the inlet manifolds 12 in the first subset are offset from the inlet manifolds in the second set. Similarly, the outlet manifolds 14 in the first subset are offset from the outlet manifolds in the second set. More particularly, the inlet manifolds in the first subset are positioned opposite to the outlet manifolds in the second subset. Similarly, the outlet manifolds in the first subset are positioned opposite to the inlet manifolds in the second subset. This offset arrangement has several advantages. By positioning the manifolds carrying hot fluid (outlet manifolds) on a first cooling face opposite to the manifolds carrying cold fluid (inlet manifolds) on the other cooling face, better "heatspreading" in the manifolds is achieved as compared to the case of aligned inlet and outlet manifolds. In addition, the offset arrangement improves the velocity and pressure distribution of the coolant, all of which contribute to improved heatsink performance.

Beneficially, heat sinks 300 provide enhanced heat transfer relative to conventional cooling of power devices. Conventional heat sinks are not integral to the press-packages but rather are self-contained, in that the coolant does not contact the power devices but rather is encased within the heat sink. Thus, conventional heat sinks include cases, which are typically coupled to press-packages via thermal grease layers, which increase the thermal resistance. Thus, conventional heat-sinks contain additional thermal layers (the case), which impede heat transfer. In contrast, heat sinks 300 are disposed integral to the press-packages, directly cooling the power devices with direct contact by the coolant, thereby enhancing the heat transfer. Further, the interleaved inlet and outlet channels deliver coolant uniformly to the surface of the device being cooled, and the millichannels increase the surface area of heat conduction from the power device to the coolant in this integral heat sink. For the embodiments illustrated in FIGS. 1-4, the heat sinks 300 are adapted for use with existing electronic packages 20, such as press-packages 20. Accordingly, heat sinks 300 can be used to integrally cool conventional press-pack power devices without modification of the device packages. Moreover, incorporating the millichannels and inlet/outlet manifolds into a single cooling piece 310 simplifies the assembly process.

A cooling and packaging stack 100 embodiment of the invention is described with reference to FIG. 5. The cooling and packaging stack 100 includes at least one heat sink 300 comprising a cooling piece 310 defining a number of inlet manifolds 12 configured to receive a coolant, a number of outlet manifolds 14 configured to exhaust the coolant, and a number of millichannels 16 configured to receive the coolant from the inlet manifolds and to deliver the coolant to the outlet manifolds. Heat sinks 300 are described above, and various details of the various embodiments of the heat sink will thus not be repeated. The cooling and packaging stack 100 further includes at least one electronic device package 20 comprising an upper contact surface 22 and a lower contact surface 24. The manifolds 12, 14 and millichannels 16 are disposed proximate to the respective one of the upper and lower contact surfaces 22, 24 for directly cooling the respective surface by direct contact with the coolant, such that the heat sink comprises an integral heat sink.

Exemplary materials for heat sink 300 are discussed above. Inlet and outlet manifolds 12, 14 are described above with reference to FIGS. 2, 6 and 8. For the embodiment shown in FIG. 6, coolant is supplied to the heat sinks 300 through inlet plenum 3 and exhausted via outlet plenum 5. Various configurations of millichannels 16 are discussed above with reference to FIGS. 2-4. The relative arrangements of the manifolds and millichannels are described above with reference to FIGS. 2 and 4. In one embodiment, the inlet and outlet manifolds 12, 14 are disposed in a radial arrangement, and the millichannels 116 are disposed in a circular (or more generally, in an axial) arrangement. In the illustrated embodiments of FIGS. 2 and 4, the millichannels 16 are disposed in a radial arrangement, and the inlet and outlet manifolds 12, 14 are disposed in a circular arrangement.

To enhance cooling, the heat sinks 300 in stack 100 may employ the millichannel design illustrated in FIG. 4. As discussed above, FIG. 4 illustrates a design to increase the number of radial channels to facilitate a reduction in pressure drop with a corresponding improvement in cooling efficiency. More particularly, for the example arrangement shown in FIG. 4, the number of radial channels is larger near the circumference of the cooling piece 310 relative to the number of radial channels near the center of the cooling piece 310. This arrangement permits the inclusion of additional radial channels for given spatial and machining constraints.

The example arrangement shown in FIG. 5 illustrates a cooling configuration with single-sided upper and lower heat sinks 300 and a double-sided, middle heat sink 300. For the illustrated embodiment, the stack 100 comprises multiple heat sinks 300 and multiple electronic device packages 20. As indicated, the heat sinks 300 and electronic device packages 20 are alternately arranged. More particularly, and as noted above, for the embodiment illustrated by FIG. 5, at least one of the heatsinks 300 comprises a double sided heat sink. The double sided heat sink comprises a cooling piece 310 having a first surface 2 and a second surface 4. A first subset of the millichannels 16, inlet manifolds 12 and outlet manifolds 14 are formed in the first surface 2 of the cooling piece 310. Similarly a second subset of the millichannels 16, inlet manifolds 12 and outlet manifolds 14 are formed in the second surface 4 of the cooling piece 310. The first subset of millichannels 16 is configured to cool an upper contact surface 22 of one of the electronic device packages 20 with the coolant. Similarly, the second subset of millichannels 16 is configured to cool a lower contact surface 24 of another of the electronic device packages 20 with the coolant. As discussed above with reference to FIG. 8, the double-sided heat sink may incorporate an offset arrangement of inlet and outlet manifolds, to further enhance heat sink performance.

For the cooling and packaging stack 100, the heat sink(s) 300 is (are) sealed to respective ones of the upper and lower contact surfaces 22, 24 of the electronic device package 20, such that the coolant flowing through the millichannels directly cools the respective one(s) of the upper and lower contact surfaces of the electronic device package 20 by direct contact with the coolant. For the example arrangement depicted in FIGS. 2 and 7, each cooling piece 310 further defines at least one groove 302. As indicated, for example, in FIG. 7, the stack 100 further comprises at least one gasket 304 disposed in the groove(s) 302 for sealing the heat sink 300 to the respective electronic device package(s) 20. In particular embodiments, the gasket 304 comprises an O-ring. Beneficially, this assembly process is relatively simple and robust, requiring few manufacturing steps and eliminating the need for more complex assembly techniques, such as soldering or other metal bonding techniques.

It should be noted that the specific arrangement shown in FIG. 5 is merely illustrative, and cooling and packaging stack 100 may include any number of electronic device packages 20 and corresponding heat sinks 300 for cooling the electronic device packages. One of the many benefits of the present invention is its flexibility and modularity for cooling a desired number of device packages.

For the exemplary embodiments discussed above with reference to FIG. 5, each of the upper contact surface 22 and lower contact surface 24 can be circular in cross-section, and each of the cooling pieces 310 can cylindrical in cross-section (i.e., a disk or hockey-puck arrangement). However, and as noted above, other geometries can be employed, including without limitation, square and rectangular cross-sections. According to more particular embodiments, the electronic device package 20 is a press-package 20. As noted above, the invention is not limited to any specific device structure. However, the following example press-package configuration is provided for illustrative purposes. In the example, the press-package 20 comprises at least one semiconductor device 21 formed on a wafer 23, as shown for example in FIG. 1. The press package 20 further includes upper and lower thermal-expansion coefficient (CTE) matched plates 25, 27 and upper and lower electrodes 28, 29, as indicated in FIG. 1, for example. The wafer 23 is disposed between the CTE plates 25, 27. The upper electrode 28 is disposed above the upper CTE plate 25, and the lower CTE plate 27 is disposed above the lower electrode 29. Each of the wafer 23, CTE plates 25, 27 and electrodes 28, 29 has a circular cross-section. For the illustrated press-pack embodiments, the stack 100 further includes an insulating (for example, ceramic) housing 26, as shown for example in FIGS. 1 and 5. Although FIGS. 1 and 5 show the heat sinks as extending outside the housing 26, in other embodiments, the cooling pieces 310 of the heat sinks 300 are disposed within the housing 26, as discussed above.

Beneficially, cooling and packaging stack 100 provides enhanced heat transfer relative to conventional cooling of power devices, with a robust and simple sealing arrangement. For example, the heat sinks can be sealed to adjacent device packages using relatively simple O-ring assemblies. In addition, in particular embodiments, heat transfer can be enhanced by contacting the coolant directly on the upper and lower contact surfaces 22, 24 of the press-pack 20. Further, by locating narrow and deep millichannels 16 directly under the power devices, the heat transfer surface area from the junction of the device to the liquid can be maximized. Relative to a conventional stack assembly of press-pack devices and liquid cooled heat sinks, the thermal resistance is greatly reduced with relatively low pressure drop and flow rate. By achieving a relatively high flow speed with a low pressure drop, cooling is enhanced.

By providing higher reliability and a larger operating margin due to improved thermal performance, the heat sink 300 and cooling and packaging stack 100 are particularly desirable for applications demanding very high reliability, such as oil and gas liquefied natural gas (LNG) and pipeline drives, oil and gas sub-sea transmission and distribution, and drives. In addition, the heat sink 300 and cooling and packaging stack 100 can be employed in a variety of applications, non-limiting examples of which include high power applications, such as metal rolling mills, paper mills and traction, etc.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A heat sink for directly cooling at least one electronic device package, the electronic device package having an upper contact surface and a lower contact surface, the heat sink comprising a cooling piece formed of at least one thermally conductive material, wherein the cooling piece defines:
   a plurality of inlet manifolds configured to receive a coolant;
   a plurality of outlet manifolds configured to exhaust the coolant, wherein the inlet and outlet manifolds are interleaved; and
   a plurality of millichannels configured to receive the coolant from the inlet manifolds and to deliver the coolant to the outlet manifolds, wherein the millichannels and inlet and outlet manifolds are further configured to directly cool one of the upper and lower contact surface of the electronic device package by direct contact with the coolant, such that the heat sink comprises an integral heat sink.

2. The heat sink of claim 1, wherein the inlet and outlet manifolds are disposed in a radial arrangement, and wherein the millichannels are disposed in a circular arrangement.

3. The heat sink of claim 1, wherein the millichannels are disposed in a radial arrangement, and wherein the inlet and outlet manifolds are disposed in a circular arrangement.

4. The heat sink of claim 1, wherein the at least one thermally conductive material is selected from the group consisting of copper, aluminum, nickel, molybdenum, titanium, copper alloys, nickel alloys, molybdenum alloys, titanium alloys, aluminum silicon carbide (AlSiC), aluminum graphite and silicon nitride ceramic.

5. The heat sink of claim 1 for directly cooling a plurality of electronic device packages, wherein the cooling piece has a first surface and a second surface, wherein a first subset of the millichannels, inlet manifolds and outlet manifolds are formed in the first surface of the cooling piece, wherein a second subset of the millichannels, inlet manifolds and outlet manifolds are formed in the second surface of the cooling piece, wherein the first subset of millichannels and inlet and outlet manifolds is configured to directly cool an upper contact surface of one of the electronic device packages with the coolant, and wherein the second subset of millichannels and inlet and outlet manifolds is configured to directly cool a lower contact surface of another of the electronic device packages with the coolant.

6. The heat sink of claim 5, wherein the inlet manifolds in the first subset are offset from the inlet manifolds in the second set, and wherein the outlet manifolds in the first subset are offset from the outlet manifolds in the second set.

7. The heat sink of claim 1, wherein a cross-section of the millichannels and a cross-section of the manifolds are selected from the group consisting of rounded, circular, trapezoidal, triangular, and rectangular cross sections.

8. The heat sink of claim 1, wherein the inlet and outlet manifolds and millichannels are configured to deliver the coolant uniformly to the respective one of the upper and lower contact surface of the electronic device package being cooled.

9. The heat sink of claim 1, wherein the cooling piece further defines a groove for receiving a gasket.

10. The heat sink of claim 9, wherein the gasket comprises an O-ring.

11. The heat sink of claim 1, wherein the millichannels are disposed in a radial arrangement, wherein the inlet and outlet manifolds are disposed in a circular arrangement, and wherein a number of radial channels is larger near a circumference of the cooling piece relative to a number of radial channels near a center of the cooling piece.

12. A cooling and packaging stack comprising:
at least one heat sink comprising a cooling piece defining a plurality of inlet manifolds configured to receive a coolant, a plurality of outlet manifolds configured to exhaust the coolant, and a plurality of millichannels configured to receive the coolant from the inlet manifolds and to deliver the coolant to the outlet manifolds, wherein the inlet and outlet manifolds are interleaved; and
at least one electronic device package comprising an upper contact surface and a lower contact surface,
wherein the manifolds and millichannels are disposed proximate to the respective one of the upper and lower contact surfaces for directly cooling the respective surface by direct contact with the coolant, such that the heat sink comprises an integral heat sink.

13. The stack of claim 12, wherein the inlet and outlet manifolds are disposed in a radial arrangement, and wherein the millichannels are disposed in a circular arrangement.

14. The stack of claim 12, wherein the millichannels are disposed in a radial arrangement, and wherein the inlet and outlet manifolds are disposed in a circular arrangement.

15. The stack of claim 12, wherein the cooling piece comprises at least one thermally conductive material selected from the group consisting of copper, aluminum, nickel, molybdenum, titanium, copper alloys, nickel alloys, molybdenum alloys, titanium alloys, aluminum silicon carbide (AlSiC), aluminum graphite and silicon nitride ceramic.

16. The stack of claim 12, comprising a plurality of heat sinks and a plurality of electronic device packages, wherein the heat sinks and electronic device packages are alternately arranged.

17. The stack of claim 16, wherein at least one of the heatsinks comprises a double sided heat sink, wherein the double sided heat sink comprises a cooling piece having a first surface and a second surface, wherein a first subset of the millichannels, inlet manifolds and outlet manifolds are formed in the first surface of the cooling piece, wherein a second subset of the millichannels, inlet manifolds and outlet manifolds are formed in the second surface of the cooling piece, wherein the first subset of millichannels and inlet and outlet manifolds is configured to directly cool an upper contact surface of one of the electronic device packages by direct contact with the coolant, and wherein the second subset of millichannels and inlet and outlet manifolds is configured to directly cool a lower contact surface of another of the electronic device packages by direct contact with the coolant.

18. The stack of claim 17, wherein the inlet manifolds in the first subset are offset from the inlet manifolds in the second set, and wherein the outlet manifolds in the first subset are offset from the outlet manifolds in the second set.

19. The stack of claim 12, further comprising an insulating housing, wherein the at least one heat sink and the electronic device package are disposed in the housing.

20. The stack of claim 12, wherein each cooling piece further defines a groove, wherein the stack further comprises at least one gasket disposed in the groove for sealing the heat sink to the respective electronic device package.

21. The stack of claim 20, wherein the gasket comprises an O-ring.

22. The stack of claim 12, wherein the millichannels are disposed in a radial arrangement, wherein the inlet and outlet manifolds are disposed in a circular arrangement, and wherein a number of radial channels is larger near a circumference of the respective cooling piece relative to a number of radial channels near a center of the cooling piece.

* * * * *